United States Patent
Bu

(10) Patent No.: US 7,483,310 B1
(45) Date of Patent: Jan. 27, 2009

(54) SYSTEM AND METHOD FOR PROVIDING HIGH ENDURANCE LOW COST CMOS COMPATIBLE EEPROM DEVICES

(75) Inventor: Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 265 days.

(21) Appl. No.: 11/591,853

(22) Filed: Nov. 2, 2006

(51) Int. Cl.
*G11C 16/04* (2006.01)

(52) U.S. Cl. .................. 365/185.26; 365/102; 365/104; 365/185.01; 365/185.05; 365/185.14; 711/103; 257/314; 438/257; 438/258

(58) Field of Classification Search .................. 365/102, 365/103, 104, 185.01, 185.05, 185.14, 185.26, 365/149; 711/103; 257/314; 438/257, 258
See application file for complete search history.

(56) References Cited

U.S. PATENT DOCUMENTS

| | | | | |
|---|---|---|---|---|
| 5,753,950 A | * | 5/1998 | Kojima | 257/315 |
| 5,790,455 A | * | 8/1998 | Caywood | 365/185.06 |
| 6,388,915 B1 | * | 5/2002 | Kato et al. | 365/145 |
| 6,842,372 B1 | * | 1/2005 | Hu | 365/185.05 |
| 2007/0064488 A1 | * | 3/2007 | Tanaka | 365/185.18 |
| 2007/0247914 A1 | * | 10/2007 | Fang et al. | 365/185.18 |

* cited by examiner

*Primary Examiner*—Richard Elms
*Assistant Examiner*—Eric Wendler

(57) ABSTRACT

A system and method are disclosed for providing EEPROM devices that combine the high endurance features of complex and expensive EEPROM devices and the low manufacturing costs of CMOS compatible EEPROM devices. A memory cell of the invention comprises a control capacitor, an erase capacitor, and a program capacitor, each of which comprises an NMOS transistor. The gates of the three NMOS transistors are connected together to form a floating gate. The drain of the NMOS transistor of the program capacitor is separately connected so that the program capacitor can also serve as a read transistor. A memory cell of the invention can be programmed or erased in an array of memory cells without disturbing the other memory cells in the array.

23 Claims, 8 Drawing Sheets

SYSTEM AND METHOD FOR PROVIDING HIGH ENDURANCE LOW COST CMOS COMPATIBLE EEPROM DEVICES

TECHNICAL FIELD OF THE INVENTION

The present invention is generally directed to the manufacture of integrated circuits and, in particular, to a system and method for providing high endurance, low cost complementary metal oxide semiconductor (CMOS) compatible EEPROM devices.

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

FIG. 1 illustrates a schematic diagram of a prior art memory cell 100 of an electrically erasable programmable read only memory (EEPROM) device. Memory cell 100 comprises one P-channel metal oxide semiconductor (PMOS) transistor 110 and one P-channel metal oxide semiconductor (PMOS) capacitor 120. The PMOS capacitor 120 is formed by connecting together the source, drain and substrate of a PMOS transistor.

The PMOS transistor 110 may be referred to as PMOS program transistor 110. The PMOS capacitor 120 may be referred to as PMOS control capacitor 120. The gate of the PMOS program transistor 110 and the gate of the PMOS control capacitor 120 are connected together (i.e., shorted together) and are isolated from the other active elements. The shorted gates of the PMOS program transistor 110 and the PMOS control capacitor 120 are collectively referred to as a "floating gate" 130. Charges (in amounts that represent either a zero ("0") representation or a one ("1") representation) may be written to the floating gate 130. In order to avoid well bias interference, the PMOS program transistor 110 and the PMOS control capacitor 120 are each located in a separate N well.

The prior art memory cell 100 is written to by injecting drain avalanche hot electrons into the floating gate 130. For PMOS operation (as shown in FIG. 1) low voltage is applied to the control gate and drain of PMOS control capacitor 120 and high voltage is applied to the source/well of PMOS program transistor 110. The channel of PMOS program transistor 110 is turned on and hot electrons are generated at the high electric field region at the drain junction (designated "$V_{INJ}$" in FIG. 1). With positive voltage on the control gate of PMOS control transistor 120, some hot electrons with high energy will pass through the silicon-silicon dioxide ($Si$—$SiO_2$) potential barrier and be injected into the floating gate 130.

The prior art memory cell 100 is erased by applying a high voltage to the control gate of the PMOS control transistor 120 and to the ground drain and source of the PMOS program transistor 110. Electrons on the floating gate 130 will pass through the gate oxide between the floating gate 130 and the control gate of the PMOS control capacitor 120 by Fowler-Nordheim (FN) tunneling process and go to the substrate. A description of the physics of the Fowler-Nordheim (FN) tunneling process is set forth in U.S. Pat. No. 5,225,362.

During programming, most control gate voltage should be coupled between the floating gate 130 and the drain/source of the PMOS program transistor 110 to facilitate electron injection to the floating gate 130 but not further to the control gate of the PMOS control transistor 120. This requires the capacitance between the floating gate 130 and the control gate to be large. On the other hand, during the erase procedure, more control gate voltage should be coupled between the floating gate 130 and the control gate, so that electrons can tunnel from the floating gate 130 to the substrate by the Fowler-Nordheim (FN) tunneling process. This requires the capacitance between the floating gate 130 and the control gate to be small.

These two contradictory requirements for the control gate capacitance during the program procedure and the erase procedure leave a narrower operation window. This results in poor data retention and slower speeds for an EEPROM that comprises one PMOS program transistor and one PMOS control capacitor.

To improve the operational speed and data retention for an EEPROM device, EEPROM designers have sometimes placed an additional capacitor in the basic memory cell. This approach has one large capacitor for the programming operation and one small capacitor for the erase operation. Capacitor coupling techniques are used to achieve a favorable electric field for both the programming operation and the erase operation.

The floating gate of an added capacitor has to be filled with hot electrons. Hot electrons that pass through gate oxide will create oxide damage. Oxide damage degrades the endurance of a memory cell. Endurance is measured by how many program/erase cycles the gate oxide can tolerate before unacceptable damage occurs. Therefore, one major drawback to adding an extra capacitor is that it degrades EEPROM memory cell endurance performance.

Another drawback to adding an extra capacitor is that it significantly increases the size of the basic memory cell. This significantly lowers the EEPROM array density. Additional chip area is required for the extra capacitors. This increases the cost.

Another drawback of prior art CMOS EEPROM technology is the speed of the programming procedure. The programming procedure is carried out by utilizing drain avalanche hot electrons. Because the efficiency of generating and injecting the drain avalanche hot electrons is low, programming times are relatively long. The programming time is usually one hundred milliseconds (100 ms) or longer. Even the improved coupling provided by using additional capacitors only reduces the programming time to about twenty milliseconds (20 ms).

FIG. 2 illustrates a schematic diagram of a prior art memory cell 200 of an erasable programmable read only memory (EEPROM) device that comprises a control capacitor and an erase capacitor. Memory cell 200 comprises program transistor 210, control capacitor 220, floating gate 230, erase capacitor 240 and read transistor 250 coupled together as shown in FIG. 2.

Prior art memory cell 200 operates in the same manner as that described for prior art memory cell 100. That is, the gate of the PMOS program transistor 210 and the gate of the PMOS control capacitor 220 are connected together (i.e., shorted together) and are isolated from the other active elements. The shorted gates of the PMOS program transistor 210 and the PMOS control capacitor 220 are collectively referred to as a "floating gate" 230. Charges (in amounts that represent either a "zero" ("0") representation or a "one" ("1") representation) may be written to the floating gate 230.

Prior art memory cell 200 comprises a PMOS erase capacitor 240 to facilitate the erase operation. The gate of the PMOS erase capacitor 240 is also connected to the floating gate 230. Prior art memory cell 200 also comprises a PMOS read transistor 250 to facilitate the read operation. The gate of the PMOS read transistor 250 is also connected to the floating gate 230. The PMOS read transistor 250 has nothing to do with the program/erase operations of memory cell 200.

The programming operation is carried out by Drain Avalanche Hot Carrier (DAHC) electron injection. Electrons from the edge of the drain junction of the program transistor 210 are injected into the floating gate 230. The erase operation is carried out by Fowler-Nordheim (FN) tunneling. Electrons from the floating gate 230 tunnel to the substrate of the erase capacitor 240.

FIG. 3 illustrates an illustrative memory cell layout design 300 for memory cell 200. The program transistor 210 and the erase capacitor 240 and the read transistor 250 are the same size. The program transistor 210 has an area ratio of one to twenty seven (1:27) with respect to the area of the control capacitor 220. During the operation of memory cell 200 this relatively high value for the coupling ratio helps lower the value of the erase voltage and the value of the program voltage.

However, the relatively high value for the coupling ratio leads to excess oxide damage. This is because (1) the large control capacitor 220 has to be filled up from a small hot electron injection point, and (2) during the erase process all the electrons stored on the large control capacitor 220 must be removed from a small erase point. This is one of the major reasons that complementary metal oxide semiconductor (CMOS) non-volatile memory (NVM) memory cells usually are capable of only one thousand (1,000) or so program/erase cycles.

Complementary metal oxide semiconductor (CMOS) non-volatile memory (NVM) memory cells should be able to perform one thousand (1,000) program/erase cycles and have a program time of approximately twenty milliseconds (20 ms). However, some CMOS NVM memory cells were found to not meet the required levels of performance. In particular, after about two hundred fifty (250) program/erase cycles some CMOS NVM memory cells became "weak programmed." The term "weak programmed" means that the read current of a memory cell becomes lower than the desired level for the read current. As the number of program/erase cycles increased, the number of failures (i.e., the number of "weak programmed" memory cells) also increased.

An investigation revealed that there are three principal factors that contribute to the creation of "weak programmed" memory cells. The first contribution is that the program/erase process causes degradation of the program current. Lower values of program current are directly related to the creation of "weak programmed" memory cells.

Experiments were conducted on a 0.44 micron by 0.40 micron metal oxide semiconductor field effect transistor (MOSFET) having a gate oxide thickness of seventy Ångstroms (70 Å). Experimental data showed that if the memory cells are programmed with Drain Avalanche Hot Carrier (DAHC) programming for twenty seconds (20 s), then the program current (IG) decreases by over fifty percent (50%). If one cycle time is one hundred milliseconds (100 ms), then the DAHC stress time of twenty seconds (20 s) is equivalent to two hundred (200) program cycles.

FIG. 4 illustrates this feature in a graph 400 of program current (IG) in amperes (A) versus time in seconds (s). The drain voltage (VD) is negative six volts (−6 V) and the gate voltage (VG) is negative one and one tenth volt (−1.1 V). As shown in FIG. 4, under a constant DAHC stress, the value of the program current (i.e., the DAHC gate injection current) (IG) decreases from approximately $2.75 \times 10^{-10}$ amperes to approximately $1.04 \times 10^{-10}$ amperes in twenty seconds (20 s). Lower program current inevitably causes "weak programmed" memory cells.

The second factor that contributes to the creation of "weak programmed" memory cells comes from the fact that the EEPROM memory cell ramps up the control gate voltage during the programming process. The ramp up of control gate voltage compensates for the floating gate voltage drop that is due to the injection of more hot electrons. However, as more and more program/erase cycles occur, the program current (i.e., the DAHC gate injection current) (IG) decreases, but the control gate voltage ramps up as normal. This phenomenon increases the floating gate voltage (VFG), which decreases the channel current in the program transistor 210. Decreasing the channel current during the programming process inevitably leads to the creation of "weak programmed" memory cells.

The third factor that contributes to the creation of "weak programmed" memory cells comes from the fact that the Drain Avalanche Hot Carrier (DAHC) programming process is sensitive to the CMOS process. A change of fifty millivolts (50 mV) in the threshold voltage ($V_{th}$) is well within CMOS specifications. However, such a change can lead to a ten percent (10%) variation in the value of program current (IG). The value of the program current (IG) is also affected by other parameters, such as drain/source series resistance, drain junction doping, gate oxide thickness variation, etc. Large variations in program current (IG) may lead to increased stress in memory cells and cause early failure in the affected memory cells.

Although CMOS non-volatile memory (NVM) memory cells are relatively low in cost, they are capable of only about one thousand (1,000) program/erase cycles. This is a low level of endurance that is significantly less than the one hundred thousand (100,000) program/erase cycles that a floating gate tunneling oxide transistor (FLOTOX) EEPROM device can provide. An example of a prior art FLOTOX EEPROM device is described in U.S. Pat. No. 5,225,362.

Although FLOTOX EEPROM devices have a high level of endurance, they are more complicated and more expensive. For example, the prior art FLOTOX EEPROM device shown in U.S. Pat. No. 5,225,362 has a double polysilicon technology and special tunnel windows. The cost of embedding such an EEPROM device into a CMOS platform is rather high because many manufacturing process steps have to be changed or added to the basic CMOS process. That is, the manufacturing process for the FLOTOX EEPROM devices is basically not CMOS compatible. On the other hand, the cost of embedding CMOS compatible EEPROM devices into a CMOS platform is very low.

Therefore, there is a need in the art for a system and method that is capable of solving the poor performance problems described above that are exhibited by prior art memory cells in electrically erasable programmable read only memory (EEPROM) devices. In particular, there is a need in the art for a system and method for providing EEPROM devices that combine the high endurance features of the more expensive EEPROM devices and the low manufacturing costs of the CMOS compatible EEPROM devices. There is a need in the art for a system and method for providing high endurance, low cost CMOS compatible EEPROM devices.

The present invention provides a high endurance, low cost CMOS compatible EEPROM memory cell that comprises three CMOS N type (NMOS) transistors. The first NMOS transistor serves as a control capacitor, the second NMOS transistor serves as an erase capacitor, and the third NMOS transistor serves as a program capacitor. The gates of the three NMOS transistors are connected together to form a floating gate.

The control capacitor is implemented by connecting together the source and the drain and the P well of the transistor. The erase capacitor is also implemented by connecting together the source and the drain and the P well of the transistor. The source and the P well of the transistor of the program capacitor are connected together but the drain of the program capacitor is separate so that the transistor of the program capacitor can also serve as a read transistor during read operations. The source and the drain and the P well of the program transistor are all three connected to a program voltage during the programming operation.

Each NMOS transistor of the EEPROM memory cell is isolated from the underlying P substrate by a Deep N Well isolation structure. This allows the well bias voltage to be isolated from other active elements on the semiconductor wafer.

In CMOS non-volatile memory (NVM) devices, the Drain Avalanche Hot Carrier (DAHC) programming operation creates more oxide damage than does the Fowler-Nordheim (FN) programming operation. The EEPROM memory cell of the present invention provides a high level of endurance (as measured by the number of program/erase cycles that can be performed) because it employs the Fowler-Nordheim (FN) tunneling method for both the programming operation and the erase operation. In addition, because the programming operation and the erase operation are conducted through two transistor gate oxides (instead of one transistor gate oxide), the damage to the gate oxide of the transistors is shared between two transistors. Therefore the EEPROM memory cell of the present invention can tolerate an increased number of program/erase cycles.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 5 through 15, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

Figure 1:
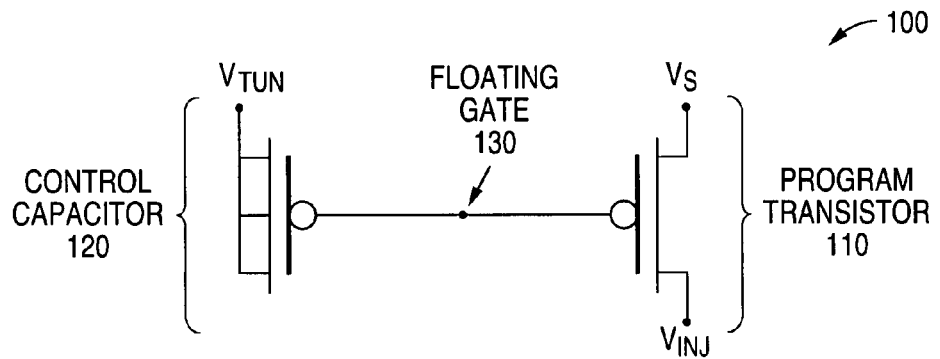
FIG. 1 illustrates a schematic diagram of a prior art memory cell of an electrically erasable programmable read only memory (EEPROM) device that comprises a control capacitor and a program transistor.
Figure 2:
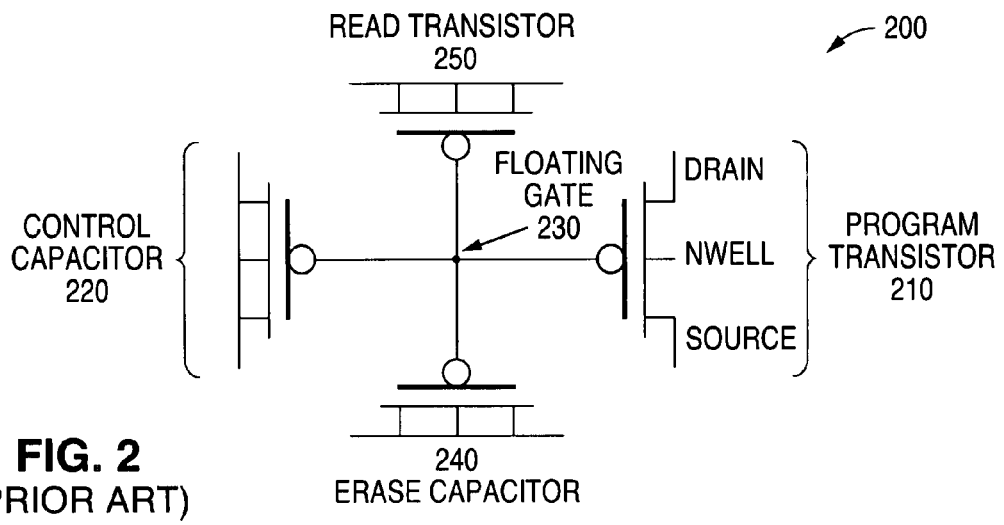
FIG. 2 illustrates a schematic diagram of a prior art memory cell of an electrically erasable programmable read only memory (EEPROM) device that comprises a control capacitor, an erase capacitor, a program transistor, and a read transistor.
Figure 3:
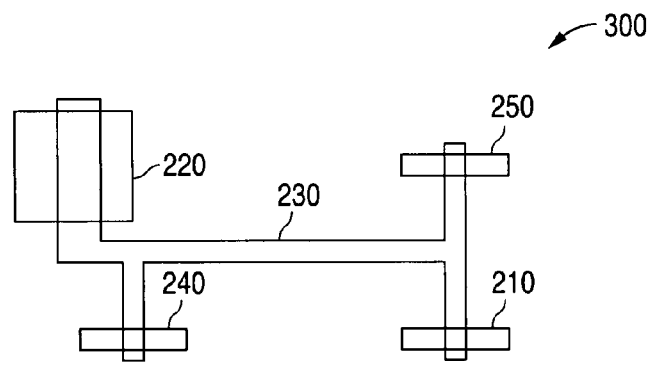
FIG. 3 illustrates a plan view of a memory cell layout design of the prior art memory cell shown in FIG. 2.
Figure 4:
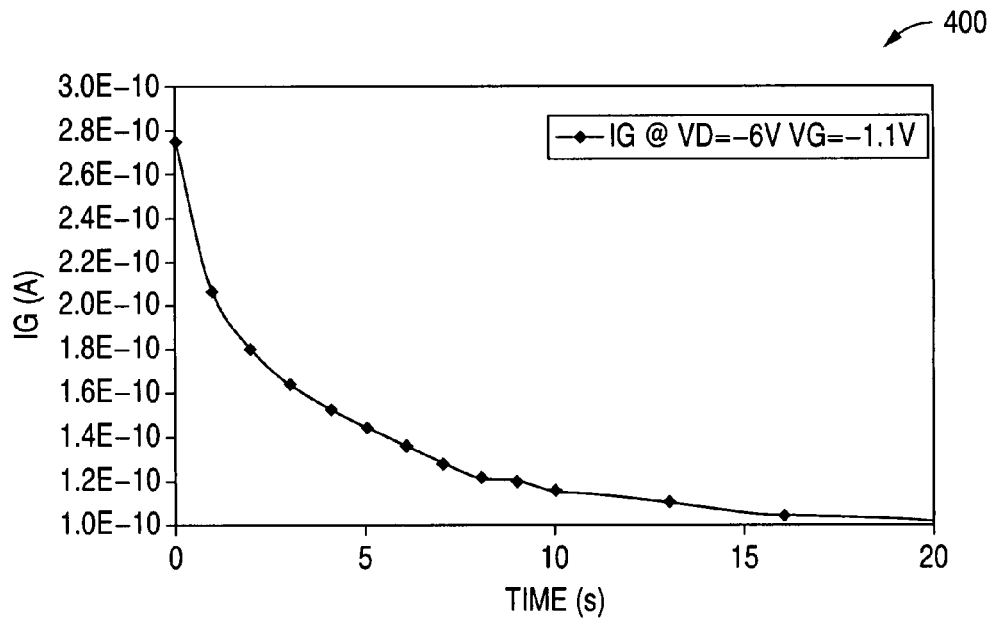
FIG. 4 illustrates a graph showing a decrease of program current versus time in a prior art memory cell.
Figure 5:
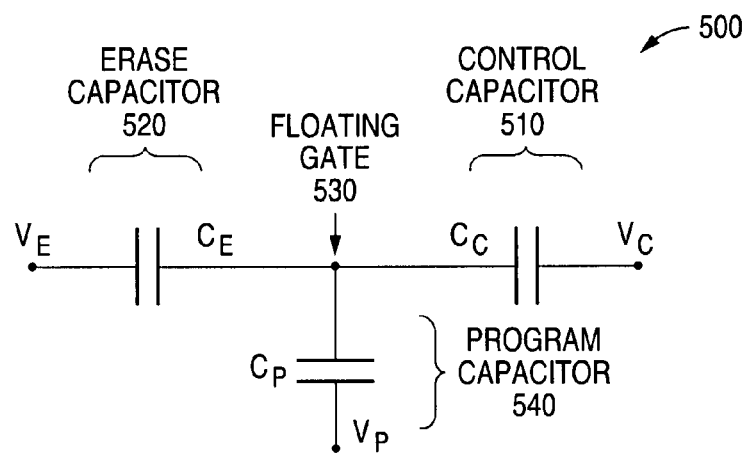
FIG. 5 illustrates a schematic diagram of an electrically erasable programmable read only memory (EEPROM) device of the present invention that comprises a control capacitor, an erase capacitor and a program capacitor.

FIG. 5 illustrates a schematic diagram of one advantageous embodiment of a memory cell 500 of an electrically erasable programmable read only memory (EEPROM) device of the present invention. Memory cell 500 comprises control capacitor 510, erase capacitor 520, floating gate 530, and program capacitor 540 coupled together as shown in FIG. 5. As will be more fully discussed below, the program capacitor 540 also performs the function of a read transistor for the memory cell 500.

The control capacitor 510, the erase capacitor 520, and the program capacitor 540 of memory cell 500 are each implemented as an N type metal oxide semiconductor (NMOS) transistor. An NMOS transistor has better gate oxide integrity (GOI) than a P type metal oxide semiconductor (PMOS) transistor. The gate of the NMOS transistor of the control capacitor 510 and the gate of the NMOS transistor of the erase capacitor 520 and the gate of the NMOS transistor of the program capacitor 540 are connected together (i.e., shorted together) and are isolated from the other active elements. The shorted gates of the three NMOS transistors that comprise the control capacitor 510, erase capacitor 520 and program capacitor 540 are collectively referred to as a "floating gate" 530. Charges (in amounts that represent either a "zero" ("0") representation or a "one" ("1") representation) may be written to the floating gate 530.

The capacitance of the control capacitor 510 is designated with the symbol $C_C$. The voltage node to the control capacitor 510 is designated with the symbol $V_C$. The capacitance of erase capacitor 520 is designated with the symbol $C_E$. The voltage node to the erase capacitor 520 is designated with the symbol $V_E$. The capacitance of program capacitor 540 is designated with the symbol $C_P$. The voltage node to the program capacitor 540 is designated with the symbol $V_P$.

Figure 6:
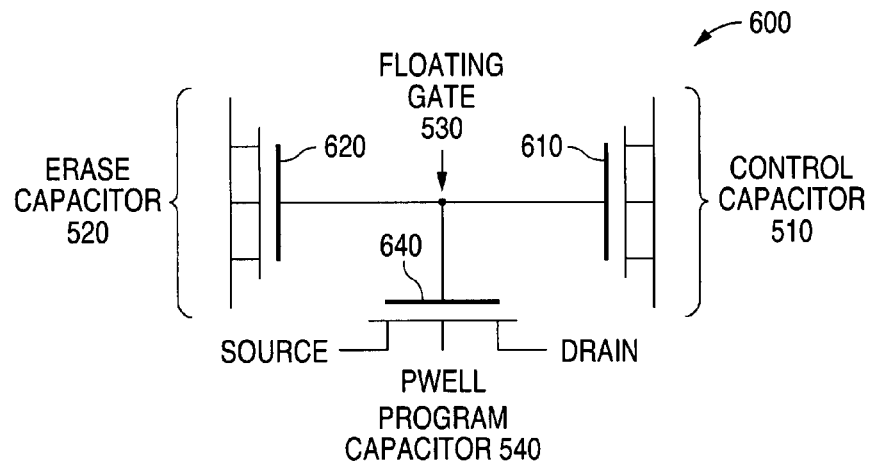
FIG. 6 illustrates a schematic diagram of an electrically erasable programmable read only memory (EEPROM) device of the present invention showing NMOS transistors that form the control capacitor, the erase capacitor and the program capacitor of FIG. 5.
Figure 7A:
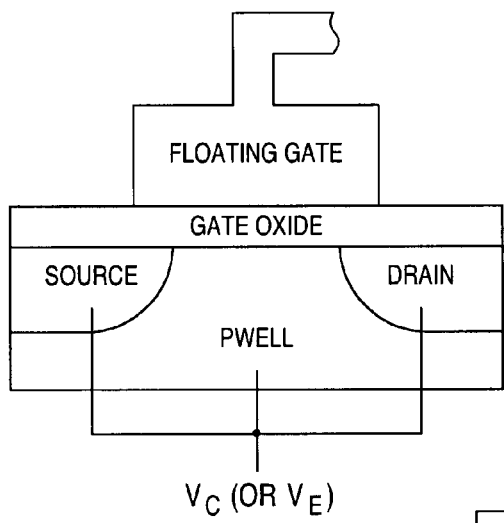
FIG. 7A illustrates a schematic diagram showing a cross sectional view of an NMOS transistor of the control capacitor (or the erase capacitor) of the present invention showing that the source and the drain and the P well of the NMOS transistor are connected.

The three NMOS transistors are shown in FIG. 6 where the memory cell is designated with reference numeral 600. The control capacitor 510 comprises an NMOS transistor 610 in which the source and the drain and the P well of the NMOS transistor 610 are tied together. This arrangement is shown in FIG. 7A for the voltage $V_C$. The erase capacitor 520 comprises an NMOS transistor 620 in which the source and the drain and the P well of the NMOS transistor 620 are tied together. This arrangement is also shown in FIG. 7A for the voltage $V_E$.

Figure 7B:
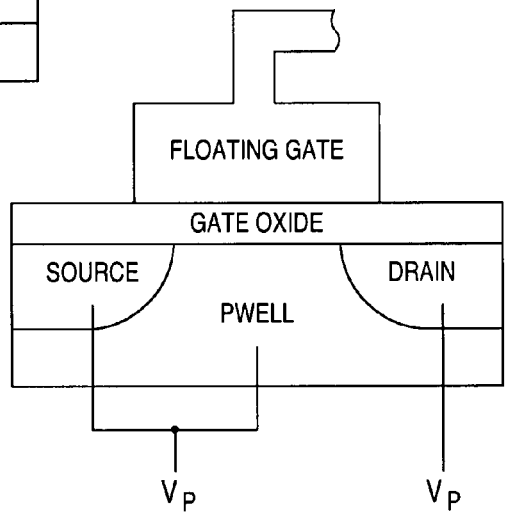
FIG. 7B illustrates a schematic diagram showing a cross sectional view of an NMOS transistor of the program capacitor of the present invention showing that the source and the P well of the NMOS transistor are connected and that the drain of the NMOS transistor has a separate connection.
Figure 8:
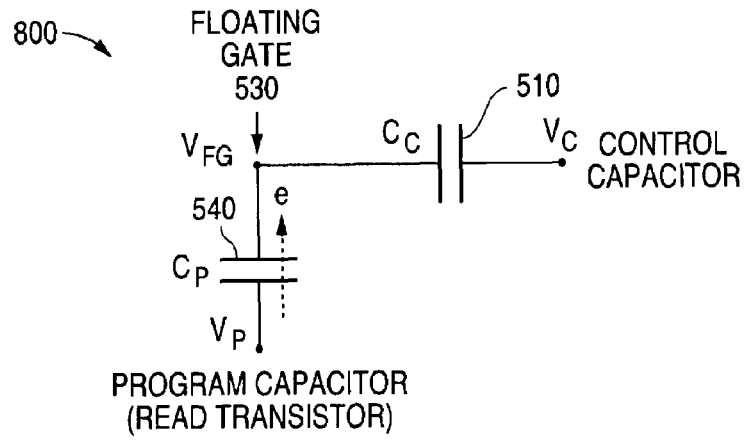
FIG. 8 illustrates a schematic diagram of a memory cell of the present invention showing the equivalent circuitry during a programming operation of the memory cell.
Figure 9:
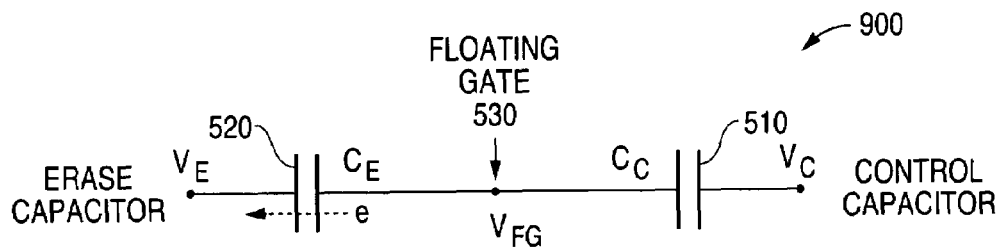
FIG. 9 illustrates a schematic diagram of a memory cell of the present invention showing the equivalent circuitry during an erase operation of the memory cell.

The program capacitor 540 comprises an NMOS transistor 640 in which the source and the P well of the NMOS transistor 640 are connected to a first terminal of the NMOS transistor 640. The drain of the NMOS transistor 640 is separately connected to a second terminal of the NMOS transistor 640. During the programming operation, the same bias voltage $V_P$ is applied to the source and to the drain and to the P well of the NMOS transistor 640. This arrangement is shown in FIG. 7B. This effectively causes the NMOS transistor 640 to function as a capacitor during the programming operation.

However, during the read operation, however, the NMOS transistor 640 operates as a read transistor. This means that the program capacitor 540 has a dual function. During the programming operation, the NMOS transistor 640 performs the programming function as a program capacitor. During the read operation, the NMOS transistor 640 performs the read function as a read transistor. This dual purpose design for NMOS transistor 640 saves one extra read transistor for each memory cell. This results in a smaller memory cell size and a larger EEPROM array density.

The size of the erase capacitor 520 and the size of the program capacitor 540 are designed to be much smaller than the size of the control capacitor 510. For example, in one advantageous embodiment, the size of the control capacitor 510 is ten (10) times larger than the size of the erase capacitor 520 and also ten (10) times larger than the program capacitor 540. The relatively small size of the erase capacitor 520 and the relatively small size of the program capacitor 540 increase the coupling ratio and decrease the size of the voltage required for the programming operation.

The programming operation of the memory cell 500 (or equivalent memory cell 600) is carried out by Fowler-Nordheim (FN) tunneling. The equivalent circuitry 800 during the programming operation is shown schematically in FIG. 8. A high voltage (e.g., 7.7 volts) is applied to the voltage node $V_C$ of the control capacitor 510 and the voltage node $V_P$ of the program capacitor 540 is grounded. Because the size of the control capacitor 510 is much larger than the size of the program capacitor 540, most of the control capacitor voltage $V_C$ is coupled to the floating gate 530. Under the influence of the high electric field, electrons from the substrate of the program capacitor 540 will tunnel through the gate oxide of the program capacitor 540 to the floating gate 530.

At the same time, the electric field across the gate oxide of the control capacitor 510 is low. This means that the number of electrons that tunnel across the gate oxide of the control capacitor 510 is negligible. Therefore, the electrons that arrive at the floating gate 530 will accumulate.

The voltage on floating gate 530 is designated as $V_{FG}$. The magnitude of the floating gate voltage $V_{FG}$ is given by:

$$V_{FG} = V_C\left(\frac{C_C}{C_C + C_P}\right) \qquad \text{Eq. (1)}$$

where $V_C$ is the control capacitor voltage $V_C$, and $C_C$ is the control capacitor capacitance $C_C$, and $C_P$ is the program capacitor capacitance $C_P$. The tunneling current into the floating gate 530 increases exponentially with the applied electric field E in accordance with the following expression for current density:

$$J = AE^2\exp\left(-\frac{B}{E}\right) \qquad \text{Eq. (2)}$$

where A and B are constants.

Consider the following numerical example. Assume that the control capacitor capacitance $C_C$ is ten (10) times larger than the program capacitor capacitance $C_P$. Also assume that the thickness of the gate oxide layer in the transistors is seventy Ångstroms (70 Å). Assume that a voltage of seven and seven tenths volts (7.7 V) is applied to the voltage node $V_C$ of the control capacitor 510. Then seven volts (7 V) is coupled to the floating gate 530. This causes an electric field E of $10^7$ V/cm to be applied across the gate oxide layer of the program capacitor 540. Equation (2) states that the resulting tunneling current density will be approximately $10^{-6}$ amp/$cm^2$.

At the same time, the electric field that is applied across the gate oxide layer of the control capacitor 510 is only $10^6$ V/cm. This means that the tunneling current density across the gate oxide layer of the control capacitor 510 is only $10^{-12}$ amp/$cm^2$. This nonlinearity guarantees an efficient programming operation in the memory cell 500.

The erase operation is also carried out by Fowler-Nordheim (FN) tunneling. The equivalent circuitry 900 during the erase operation is shown schematically in FIG. 9. A high voltage (e.g., 7.7 volts) is applied to the voltage node $V_E$ of the erase capacitor 520 and the voltage node $V_C$ of the control capacitor 510 is grounded. Because the size of the control capacitor 510 is much larger than the size of the erase capacitor 520, most of the voltage is coupled to the gate oxide of the erase capacitor 520. Under the influence of the high electric field, electrons from the floating gate 530 will tunnel from the floating gate 530 to the substrate of the erase capacitor 520.

Consider the following numerical example. Assume that the control capacitor capacitance $C_C$ is ten (10) times larger than the erase capacitor capacitance $C_E$. Also assume that the thickness of the gate oxide layer in the transistors is seventy Ångstroms (70 Å). Assume that a voltage of seven and seven tenths volts (7.7 V) is applied to the voltage node $V_E$ of the erase capacitor 520. Then seven tenths volt (0.7 V) is coupled to the floating gate 530. This causes an electric field E of $10^7$ V/cm to be applied across the gate oxide layer of the erase capacitor 520. Equation (2) states that the resulting tunneling current density will be approximately $10^{-6}$ amp/cm$^2$. This is a significant level of Fowler-Nordheim (FN) tunneling current that is sufficient to effectively discharge the floating gate 530.

The programming operation and the erase operation are carried out respectively through the program capacitor 540 and the erase capacitor 520. Therefore, the damage to the gate oxide layers of the capacitors is shared between the two capacitors. Sharing the gate oxide layer damage between the two capacitors means that the memory cell 500 can tolerate more program/erase cycles.

Figure 10:
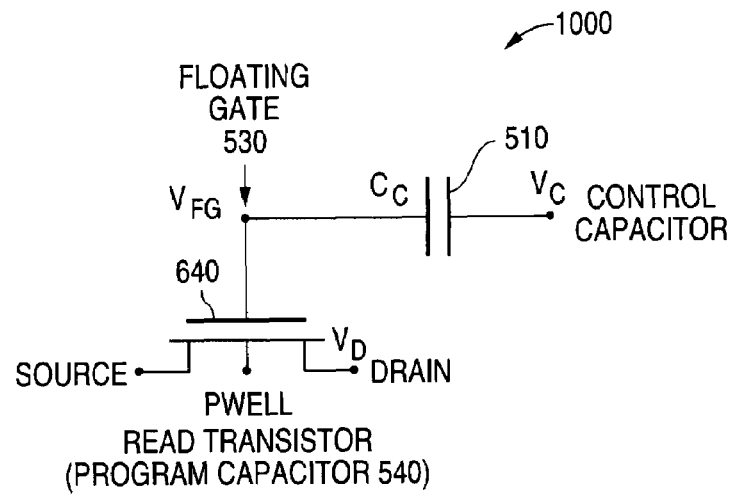
FIG. 10 illustrates a schematic diagram of a memory cell of the present invention showing the equivalent circuitry during a read operation of the memory cell.

The equivalent circuitry 1000 during the read operation is shown schematically in FIG. 10. The read operation is carried out by applying an appropriate bias voltage (e.g., 2.5 volts) to the voltage node $V_C$ of the control capacitor 510 by applying an appropriate bias voltage (e.g., 1.8 V) and to the drain terminal $V_D$ of the read transistor 640 of the program capacitor 540. All other terminals are grounded. The relative presence or absence of electrons on the floating gate 530 changes the threshold voltage of the read transistor 640. A high threshold voltage and a low drain current (with many electrons on the floating gate 530) is read as a logic "one" ("1") in the EEPROM memory cell 600. A low threshold voltage and a high drain current (with few electrons or even a positive charge on the floating gate 530) is read as a logic "zero" ("0") in the EEPROM memory cell 600.

The present invention employs NMOS transistors instead of PMOS transistors. Because CMOS fabrication methods generally use a P type substrate, the P wells of NMOS transistors are usually shorted to the wafer substrate. The method of the present invention would not work if normal (default) CMOS fabrication methods were employed. Therefore, the present invention provides a structure that prevents the P wells of the NMOS transistors from being shorted to the wafer substrate.

Figure 11:
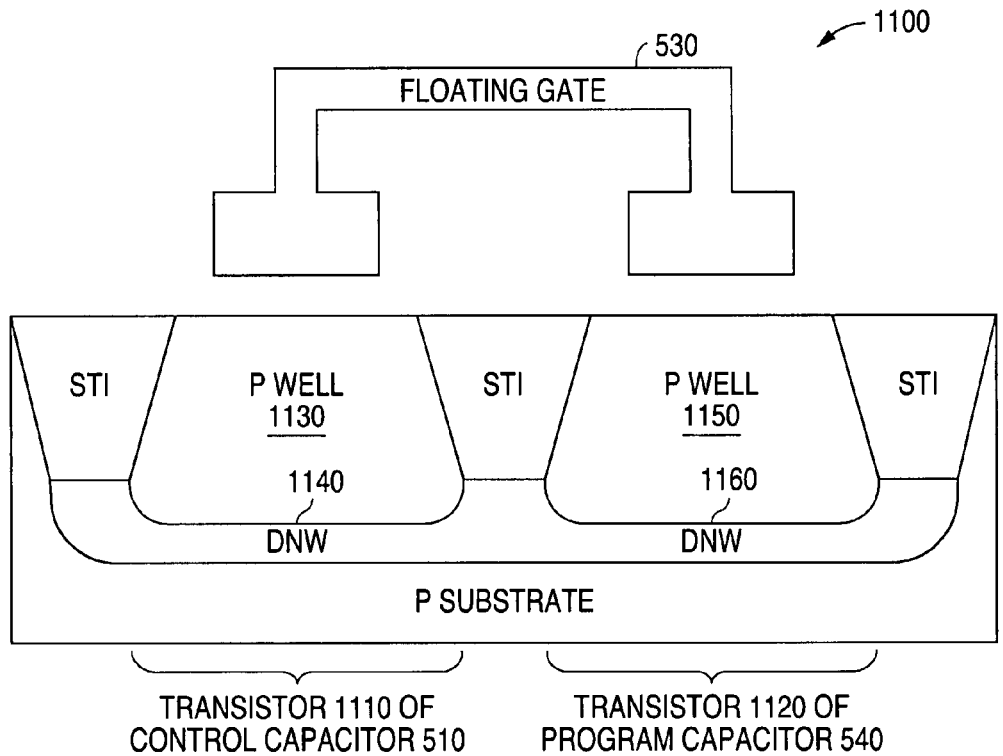
FIG. 11 illustrates a schematic diagram showing a cross sectional view of an NMOS transistor of the control capacitor of the present invention and an NMOS transistor of the program capacitor of the present invention showing that the transistors are isolated from an underlying P substrate by a Deep N Well isolation structure.

The present invention employs a Deep N Well ("DNW") isolation structure to isolate the P wells of the NMOS transistors. This arrangement is shown in FIG. 11. FIG. 11 shows a cross sectional view 1100 of an NMOS transistor 1110 of control capacitor 510 and a cross sectional view of an NMOS transistor 1120 of program capacitor 540. The gate oxide layers are not shown in FIG. 11. NMOS transistor 1110 is located in a first P well 1130 over Deep N Well 1140. NMOS transistor 1120 is located in a second P well 1150 over Deep N Well 1160. The NMOS transistor 1110 and the NMOS transistor 1120 are isolated by shallow trench isolation structures (designated with the letters "STI" in FIG. 11). When a bias voltage (whether $V_C$ or $V_E$ or $V_P$) is applied to a P well, the Deep N Well under the P well isolates the P well from the P substrate and from other active elements on the wafer.

All memory cells that are located in different isolated P wells can share one Deep N Well in a large size array of memory cells. For this reason the implementation of the Deep N Well design in the manufacture of EEPROM memory cells of the present invention does not increase the size of the memory cells. This is in contrast to the memory cell size increase that is required when PMOS transistors are used (as in the prior art). The EEPROM memory cell design of the present invention is very "portable" in that it may be easily and inexpensively employed in Deep N Well CMOS platforms.

The EEPROM memory cells of the present invention exhibit a high level of endurance (as measured by the number of program/erase cycles that can be performed). The EEPROM memory cells of the present invention are capable of performing up to one hundred thousand (100,000) program/erase cycles. One major reason for the high endurance level is that the EEPROM memory cells of the present invention use Fowler-Nordheim (FN) tunneling method to carry out both the programming operation and the erase operation.

It is known that CMOS compatible EEPROM memory cells that employ channel hot carrier injection for the programming operation generally have poor levels of endurance. The number of program/erase cycles of such EEPROM memory cells is usually less than one thousand (1,000) program/erase cycles.

It is well known that most hot electrons that are generated in a channel hot carrier injection process cannot be injected into a prior art floating gate (130 or 230) unless they have (1) sufficient energy, (2) the right trajectory and (3) no further impact with the silicon lattice before they reach the floating gate. Hot electrons that reach the floating gate may be said to be the "lucky" hot electrons.

Hot electrons that do not satisfy the three conditions mentioned above (i.e., the "unlucky" hot electrons) do not reach the floating gate and do not contribute to changing the nonvolatile memory (NVM) state of the memory cell. Instead, the "unlucky" electrons damage the gate oxide, create an interface between the silicon (Si) and the silicon dioxide (SiO$_2$), and thus degrade the cycling performance of the memory cell.

Only a relatively few of the hot electrons that are generated can be expected to be injected into the floating gate. Drain Avalanche Hot Carrier (DAHC) injection only occurs along the edge of the drain of the transistor. The edge of the drain represents a relatively small area of the transistor. In contrast, the Fowler-Nordheim (FN) tunneling process occurs along the entire length of the channel of the transistor between the source and the drain.

In order to fill a floating gate area of a given size with electrons in a given amount of time, it takes a high density DAHC current. A high density DAHC current is intense and creates a great deal of oxide damage in the oxide above the edge of the drain. In contrast, in the Fowler-Nordheim (FN) tunneling process has a low current density because the tunneling process occurs over a larger area. The oxide damage is relatively light and is distributed over the entire channel area.

Another reason for the high endurance level of the EEPROM memory cells of the present invention is the use of NMOS transistors instead of PMOS transistors. The gate oxide integrity (GOI) of NMOS transistors is better than the gate oxide integrity (GOI) of PMOS transistors.

Another reason for the high endurance level of the EEPROM memory cells of the present invention is the use of two transistors (instead of one transistor) to perform the programming operation and the read operation. The gate oxide damage is shared between the gate oxide of the transistor of the program capacitor 540 and the gate oxide of the transistor of the erase capacitor 520.

Another reason for the high endurance level of the EEPROM memory cells of the present invention is a better coupling between the P well and the floating gate 530. The better coupling is due to the fact that the P well of the NMOS control capacitor 510 will be in an accumulation mode when a positive bias is applied. This is in contrast to a PMOS control capacitor. When a positive bias is applied to a PMOS control capacitor, the N well of the PMOS control capacitor will be in a depletion mode. Therefore the coupling between a PMOS control capacitor and the floating gate 530 would not be as good as the coupling between the NMOS control capacitor 510 and the floating gate 530.

The improved coupling provided by the EEPROM memory cells of the present invention (1) decreases the EEPROM natural threshold voltage (Vth), and (2) decreases read access time, and (3) decreases the read disturb level.

Another advantage of the EEPROM memory cells of the present invention is that they require a smaller size charge pump to generate the required operating voltage. DAHC operation requires a charge pump that generates a low voltage (e.g., five volts (5.0 V)) and a high current (e.g., two hundred microamperes (200 μA)). A low voltage, high current charge pump requires a relatively large amount of chip area. For example, in a thirty five hundredths micron (0.35 μm) CMOS platform, a low voltage, high current charge pump may occupy a chip area of as much as three hundred twenty thousand square microns (320,000 μm²).

On the other hand, Fowler-Nordheim (FN) tunneling operation requires a charge pump that generates a high voltage (e.g., seven and seven tenths volts (7.7 V)) and a low current (e.g., forty picoamperes (40 μA)). A high voltage, low current charge pump requires a relatively small amount of chip area. For example, in a thirty five hundredths micron (0.35 μm) CMOS platform, a high voltage, low current charge pump may occupy a chip area of as little as forty five thousand square microns (45,000 μm²).

The use of the EEPROM memory cells of the present invention provides a significant saving in chip area due to the smaller size of the charge pump that is required for the EEPROM memory cells. The charge pump for the EEPROM memory cells of the present invention takes only approximately one seventh (⅐) of the chip area that is required for a charge pump for the prior art EEPROM cells.

Figure 12:
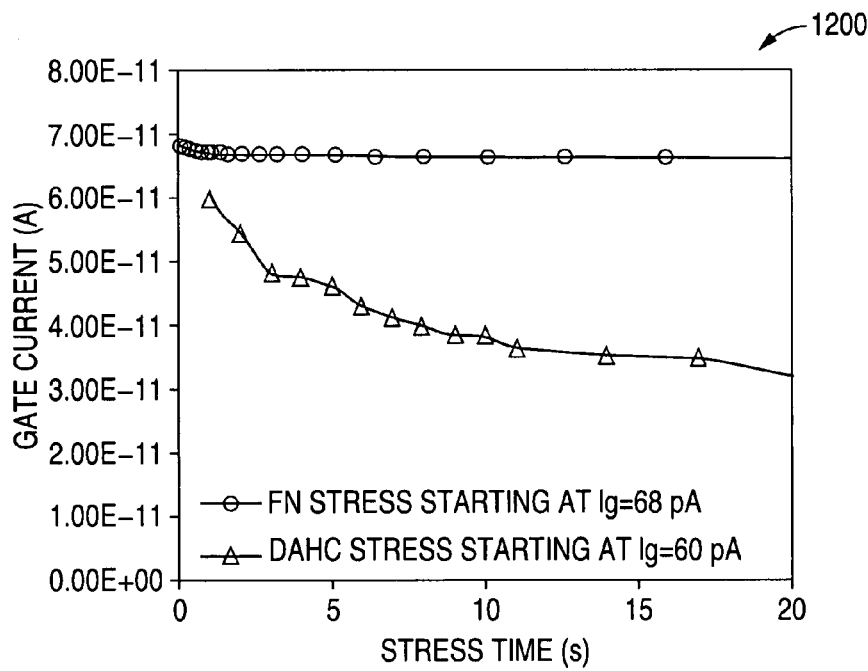
FIG. 12 illustrates a graph showing a comparison of the degradation of program current (gate current) versus time in a prior art memory cell and a memory cell of the present invention.

FIG. 12 illustrates a graph 1200 that shows the results of experiments carried out (1) on prior art EEPROM memory cells that perform the programming operation using the Drain Avalanche Hot Carrier (DAHC) method, and (2) on EEPROM memory cells of the present invention that use the Fowler-Nordheim (FN) tunneling method to perform both the programming operation and the erase operation.

FIG. 12 illustrates a graph showing a comparison of the degradation of program current (gate current) measured in amperes (A) versus stress time measured in seconds (s). The line with triangular data points represents the performance of the prior art memory cell with DAHC programming. The initial gate current is sixty (60) picoamperes. As shown in FIG. 12, the DAHC programming method creates serious oxide damage and the program current (gate current) decreases by approximately fifty percent (50%) within ten seconds (10 s).

The line in FIG. 12 with circular data points represents the performance of the memory cell of the present invention with the Fowler-Nordheim (FN) tunneling programming method. The initial gate current is sixty eight (68 picoamperes). As shown in FIG. 12, even with the slightly higher initial programming current (gate current) (i.e., the same or faster programming speed for the same size floating gate), the oxide damage is significantly less for the FN tunneling programming method. The programming current (gate current) degrades very little over time.

With the same size floating gate and the same initial programming current (gate current), experiments have shown that the FN tunneling programming method provides an endurance performance that is at least two (2) orders of magnitude better than the endurance performance of the DAHC programming method.

Figure 13:
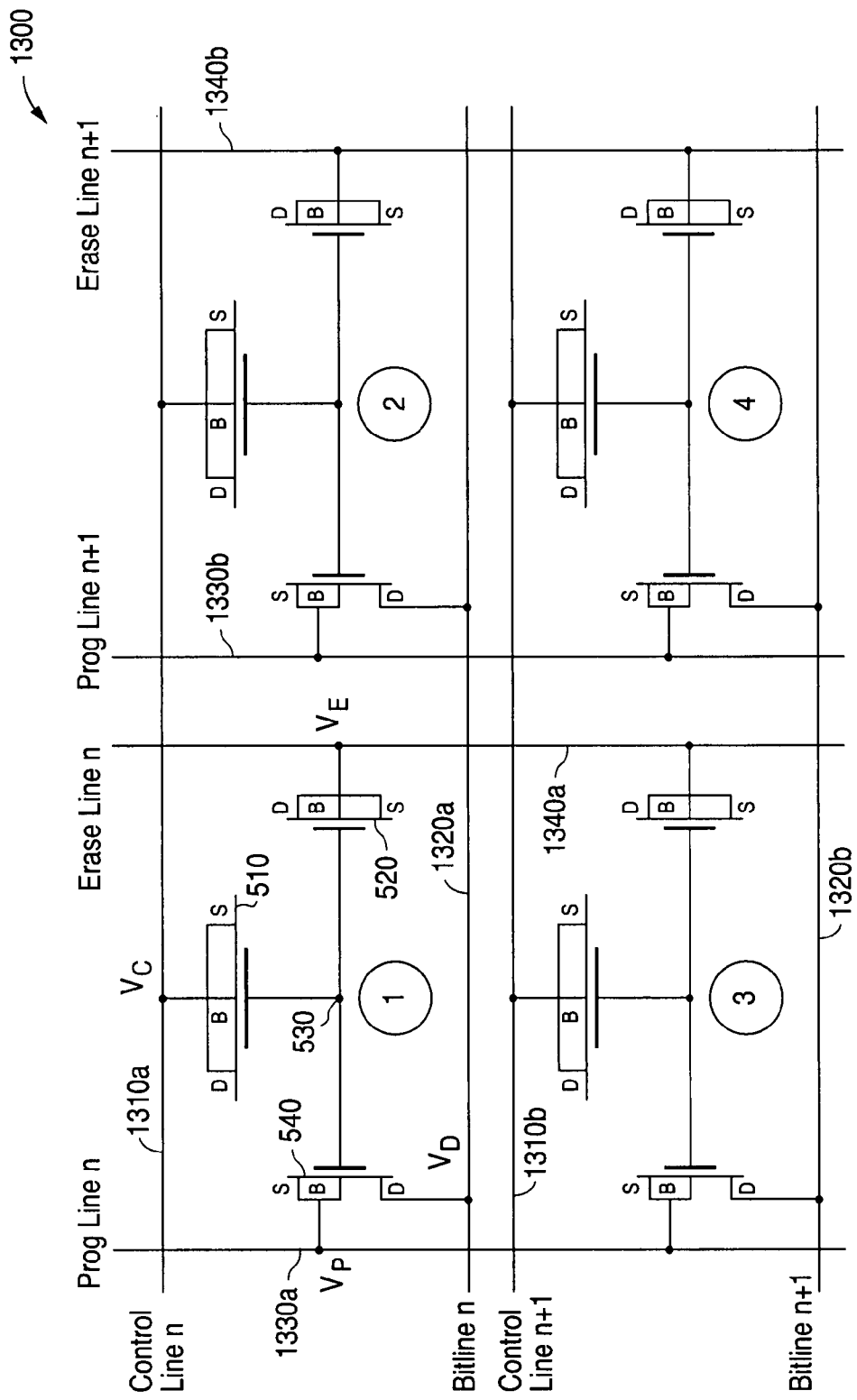
FIG. 13 illustrates a memory array architecture incorporating memory cells of the present invention.

FIG. 13 illustrates a memory array architecture 1300 incorporating a plurality of memory cells 500 of the present invention. The memory array architecture 1300 will be referred to as array 1300. Array 1300 comprises a plurality of lines arranged as shown in FIG. 13. The first plurality of lines is a plurality of control lines 1310. The second plurality of lines is a plurality of bitlines 1320. The third plurality of lines is a plurality of program lines 1330. The fourth plurality of lines is a plurality of erase lines 1340.

FIG. 13 shows a first illustrative control line 1310a designated as "Control Line n" and a second illustrative control line 1310b designated as "Control Line n+1". FIG. 13 also shows a first illustrative bitline 1320a designated as "Bitline n" and a second illustrative bitline 1320b designated as "Bitline n+1". FIG. 13 also shows a first illustrative program line 1330a designated as "Prog Line n" and a second illustrative program line 1330b designated as "Prog Line n+1". FIG. 13 also shows a first illustrative erase line 1340a designated as "Erase Line n" and a second illustrative erase line 1340b designated as "Erase Line n+1".

A first memory cell (designated "Cell 1") of the array 1300 is located between Control Line n 1310a, Bitline n 1320a, Prog Line n 1330a and Erase Line n 1340a. A second memory cell (designated "Cell 2") of the array 1300 is located between Control Line n 1310a, Bitline n 1320a, Prog Line n+1 1330b and Erase Line n+1 1340b. A third memory cell (designated "Cell 3") of the array 1300 is located between Control Line n+1 1310b, Bitline n+1 1320b, Prog Line n 1330a and Erase Line n 1340a. A fourth memory cell (designated "Cell 4") of the array 1300 is located between Control Line n+1 1310b, Bitline n+1 1320b, Prog Line n+1 1330b and Erase Line n+1 1340b.

Cell 1 comprises control capacitor 510, erase capacitor 520 and program capacitor 540 connected as shown in FIG. 13. The gates of the transistors are connected together to form floating gate 530. The source and the drain and the body of the NMOS transistor of the control capacitor 510 are connected to the Control Line n 1310a at voltage node $V_C$. The source and the drain and the body of the NMOS transistor of the erase capacitor 520 are connected to the Erase Line n 1340a at voltage node $V_E$. The source and body of the NMOS transistor of the program capacitor 540 are connected to Prog Line n 1330a at voltage node $V_P$. The drain of the NMOS transistor of the program capacitor 540 is connected to the Bitline n 1320a at voltage node $V_D$.

Cell 2 and Cell 3 and Cell 4 comprise the same structure as Cell 1. Each control capacitor 510 and each erase capacitor 520 and each program transistor 540 of the other cells (Cell 2, Cell 3, Cell 4) are connected to their respective control lines, bitlines, program lines and erase lines in the same manner as described for Cell 1. The connections for the control capacitors 510 and for the erase capacitors 520 and for the program transistors 540 of Cell 2, Cell 3 and Cell 4 are shown in FIG. 13.

An exemplary operation of array 1300 will now be described. Assume that the CMOS gate oxide thickness in the transistors is one hundred Ångstroms (100 Å). "Memory State 1" will be represented by the presence of electrons on the floating gate 530 of memory cell 500. When "Memory State 1" is read there will be low channel current and a high threshold voltage Vth. "Memory State 0" will be represented by the absence of electrons on the floating gate 530 of memory cell 500. When "Memory State 0" is read there will be high channel current and a low threshold voltage Vth.

Cell 1 of the array 1300 will be programmed to "Memory State 1" (1) by applying a high voltage (e.g., ten volts (10 V)) on Control Line n 1310a, and (2) by applying a zero voltage (e.g., zero volts (0 V)) on Bitline n 1320a, and (3) by applying a zero voltage (0 V) to Prog Line n 1330a, and (4) by leaving the Erase Line n 1340a floating. Application of these voltages on the lines of array 1300 programs Cell 1 to "Memory State 1".

To read the logical status of Cell 1 the following voltages are applied to the array lines. Cell 1 of the array 1300 is read (1) by applying a first read voltage (e.g., one and two tenths volt (1.2 V)) to the Control Line n 1310a, and (2) by applying a second read voltage (e.g., one half volt (0.5 V)) to Bitline n 1320a, and (3) by applying a zero voltage (0 V) to the Prog Line n 1330a and to the Erase Line n 1340a.

Cell 1 of the array 1300 will be programmed to "Memory State 0" by erasing Cell 1. Cell 1 will be erased (1) by applying a high voltage (e.g., ten volts (10 V)) to Erase Line n 1340a, and (2) by applying a zero voltage (0 V) to the Control Line 1310a, and (3) by leaving the Prog Line n 1330a and the Bitline n 1320a floating. Application of these voltages on the lines of array 1300 programs Cell 1 to "Memory State 0".

The memory cells 500 and the array 1300 of the present invention provide a significant advantage in that the array 1300 is capable of performing a true single bit program/erase function. That is, the system and method of the present invention is capable of programming or erasing a single memory cell in the array without disturbing the contents of other memory cells in the array. In prior art systems, sometimes the programming or erasure of a single memory cell will alter the contents of one or more other memory cells. This disturbance of the non-programmed memory cells is referred to as "program/erase disturb." As more fully described below, the system and method of the present invention inhibits the "program/erase disturb" phenomenon.

An exemplary operation of array 1300 with "program/erase disturb" inhibition will now be described. First consider the case where Cell 1 is being programmed. While the programming voltages are being applied to the array lines, a second voltage (e.g., five volts (5 V)) is applied on the Prog Line n+1 1330b and on the Erase Line n+1 1340b. The magnitude of the second voltage (e.g., five volts (5 V)) is less than the magnitude of the high voltage (e.g., ten volts (10 V)) that is applied to program Cell 1. In addition, a zero voltage (0 V) is applied to Control Line n+1 1310b.

This arrangement causes the effective voltage across the gate oxides of Cell 2 and Cell 4 to be less than the high program voltage of Cell 1. In the example, the effective voltage across the gate oxides of Cell 2 and Cell 4 will only be five volts (5 V). Due to the nonlinearity of the Fowler-Nordheim (FN) tunneling process, this lower voltage of five volts (5 V) will not be sufficient to program (or erase) Cell 2 or Cell 4. Note that Cell 3 is also safe because each of the terminals of Cell 3 is at zero volts (0 V) or is floating.

In one advantageous embodiment of the invention, the second lower voltage (i.e., the lower voltage that inhibits the "program/erase disturb" phenomenon) is equal to one half of the high program voltage that is used to program Cell 1. It is understood, however, that the present invention is not limited to this particular value for the second lower voltage. Any value for the second lower voltage may be used as long as the difference in voltage between the high program voltage for Cell 1 and the value of the second lower voltage for Cell 2 and Cell 4 results in a value of voltage across the gate oxides in Cell 2 and in Cell 4 that is insufficient to program Cell 2 and Cell 4.

Cell 2, Cell 3 and Cell 4 also represent other memory cells 500 of array 1300 that are not shown in FIG. 13. For example, Cell 2 represents other cells (not shown) that are located to the right of Cell 2 between Control Line n 1310a and Bitline n 1320a. Cell 3 represents other cells (not shown) that are located below Cell 3 between Prog Line n 1330a and Erase Line n 1340a. Similarly, Cell 4 represents other cells (not shown) that are located below Cell 4 between Prog Line n+1 1330b and Erase Line n+1 1340b. Cell 4 also represents other cells (not shown) that are located to the right of Cell 4 between Control Line n+1 1310b and Bitline n+1 1320b.

Now consider the case where Cell 1 is being erased. While the erase voltages are being applied to the array lines, a second voltage (e.g., five volts (5 V)) is applied on the Control Line n+1 1310b. The magnitude of the second voltage (e.g., five volts (5 V)) is less than the magnitude of the high voltage (e.g., ten volts (10 V)) that is applied to the Erase Line n 1340a to erase Cell 1.

This arrangement causes the effective voltage across the gate oxide of Cell 3 to be less than the high voltage (e.g., ten volts (10 V)) that is applied to the Erase Line n 1340a. In the example, the effective voltage across the gate oxide of Cell 3 will only be five volts (5 V). Due to the nonlinearity of the Fowler-Nordheim (FN) tunneling process, this lower voltage of five volts (5 V) will not erase Cell 3. Note that Cell 2 and Cell 4 are also safe because each of the terminals of Cell 2 and Cell 4 is at zero volts (0 V) or is floating.

In one advantageous embodiment of the invention, the second lower voltage (i.e., the lower voltage that inhibits the "program/erase disturb" phenomenon) is equal to one half of the high program voltage that is used to erase Cell 1. It is understood, however, that the present invention is not limited to this particular value for the second lower voltage. Any value for the second lower voltage may be used as long as the difference in voltage between the high erase voltage for Cell 1 and the value of the second lower voltage for Cell 3 results in a value of voltage across the gate oxide in Cell 3 that is insufficient to erase Cell 3.

The operation of array 1300 carries out both the programming operation and the erase operation of one memory cell (Cell 1) in a manner that inhibits the "program/erase disturb" phenomenon in the other memory cells (Cell 2, Cell 3, Cell 4).

As previously mentioned, the second lower voltage that inhibits the "program/erase disturb" phenomenon is preferably equal to one half of the high voltage that is used to program (or erase) Cell 1. The following remarks explain why the value of "one half" represents an effective value of voltage.

When Cell 1 is programmed, a value of ten volts (10 V) is placed on Control Line n 1310a. All of the memory cells that are located along Control Line n 1310a will see ten volts. But only Cell 1 is to be programmed. Therefore, in order to protect Cell 2 the second lower voltage is placed on Prog Line n+1 1330b and placed on Erase Line n+1 1340b. The magnitude of the second lower voltage should be high enough so that the effective voltage across the gate oxide of Cell 2 (i.e., ten volts (10 V) minus the second lower voltage) is low enough to protect Cell 2. But the magnitude of the second lower voltage should be low enough so that Cell 4 will not be disturbed. A value of one half (50%) of the high voltage (ten volts (10 V)) (or five volts (5 V) in the example) represents a good tradeoff between these two competing requirements.

Similarly, when Cell 1 is erased, a value of ten volts (10 V) is placed on Erase Line n 1340a. Then Cell 3 is at risk. In order to prevent Cell 3 from being disturbed the second lower voltage is placed on Control Line n+1 1310b. The magnitude of the second lower voltage should be (1) high enough to lower the effective voltage across the gate oxide of Cell 3, and (2) low enough to not disturb Cell 4. Cell 4 will see the second lower voltage at Control Line n+1 1310b. A value of one half (50%) of the high voltage (ten volts (10 V)) (or five volts (5 V) in the example) represents a good tradeoff between these two competing requirements.

Figure 14:
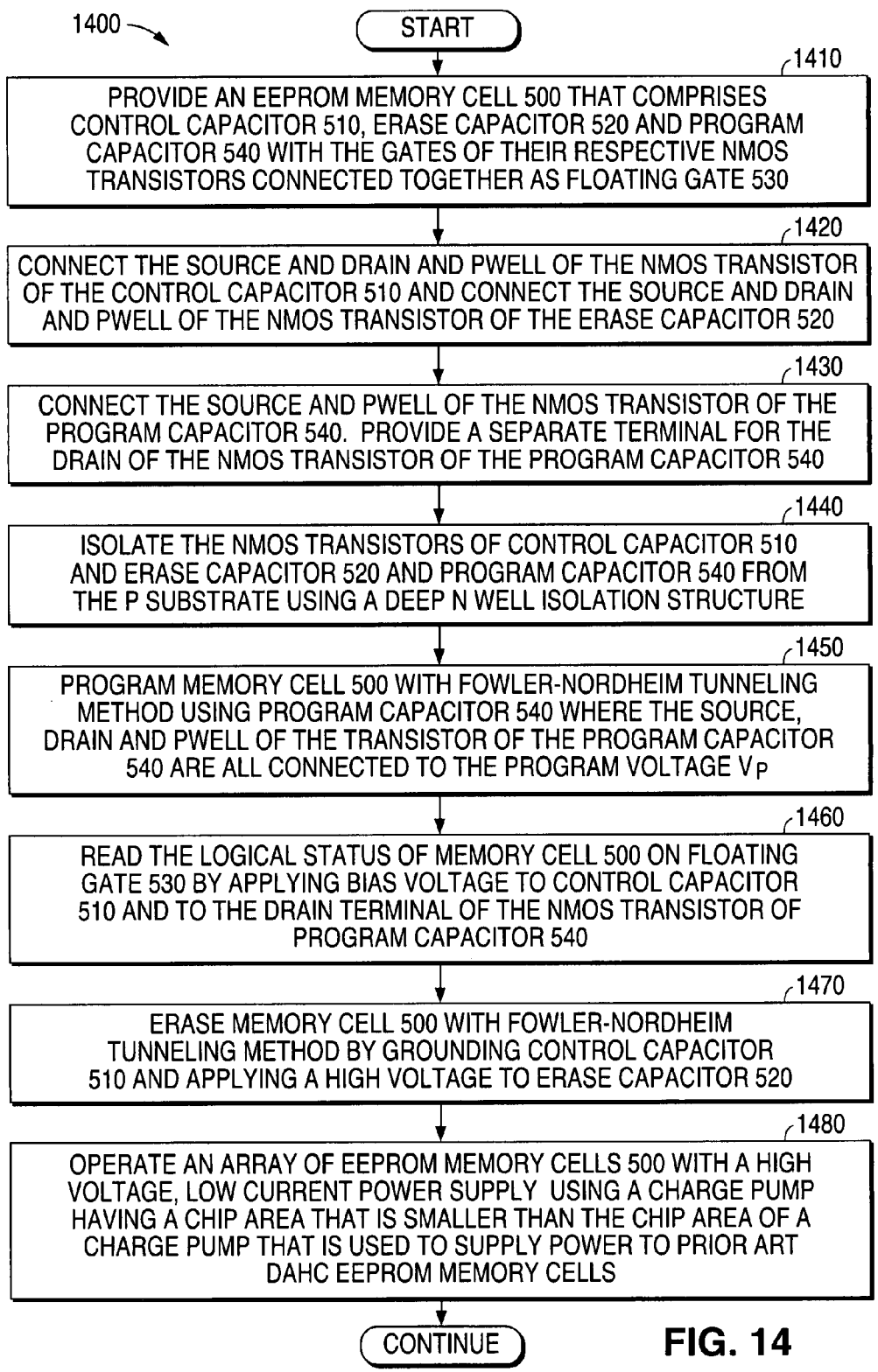
FIG. 14 illustrates a flow chart showing the steps of a first advantageous embodiment of the method of the present invention.

FIG. 14 illustrates a flow chart 1400 showing the steps of an advantageous embodiment of the method of the present invention. An EEPROM memory cell 500 of the present invention is provided that comprises a control capacitor 510, an erase capacitor 520 and a program capacitor 540 in which the gates of their respective NMOS transistors are connected together as floating gate 530 (step 1410). The source and the drain and the P well of the NMOS transistor of the control capacitor 510 are connected together and the source and the drain and the P well of the NMOS transistor of the erase capacitor 520 are connected together (step 1420).

The source and the P well of the NMOS transistor of the program capacitor 540 are connected together and connected to a first terminal and a second separate terminal is provided for the drain of the NMOS transistor of the program capacitor 540 (step 1430). The respective NMOS transistors of the control capacitor 510 and the erase capacitor 520 and the program capacitor 540 are isolated from the underlying P substrate by using a Deep N Well isolation structure (step 1440). The EEPROM memory cell 500 is programmed with the Fowler-Nordheim (FN) tunneling method using the program capacitor 540 where the source and the drain and the P well of the program capacitor 540 are separately connected to the program voltage $V_P$ (step 1450).

The logical status of the EEPROM memory cell 500 on the floating gate 530 is read by applying bias voltage to the control capacitor 510 and to the drain terminal of the NMOS transistor of the program capacitor 540 (step 1460). The EEPROM memory cell 500 is erased with the Fowler-Nordheim (FN) tunneling method by grounding the control capacitor 510 and applying a high voltage to the erase capacitor 520 (step 1470).

An array 1300 of the EEPROM memory cells 500 of the present invention is operated with a high voltage, low current power supply using a charge pump that has a chip area that is smaller than the chip area of a charge pump that is used to supply power to prior art DAHC EEPROM memory cells (step 1480).

Figure 15:
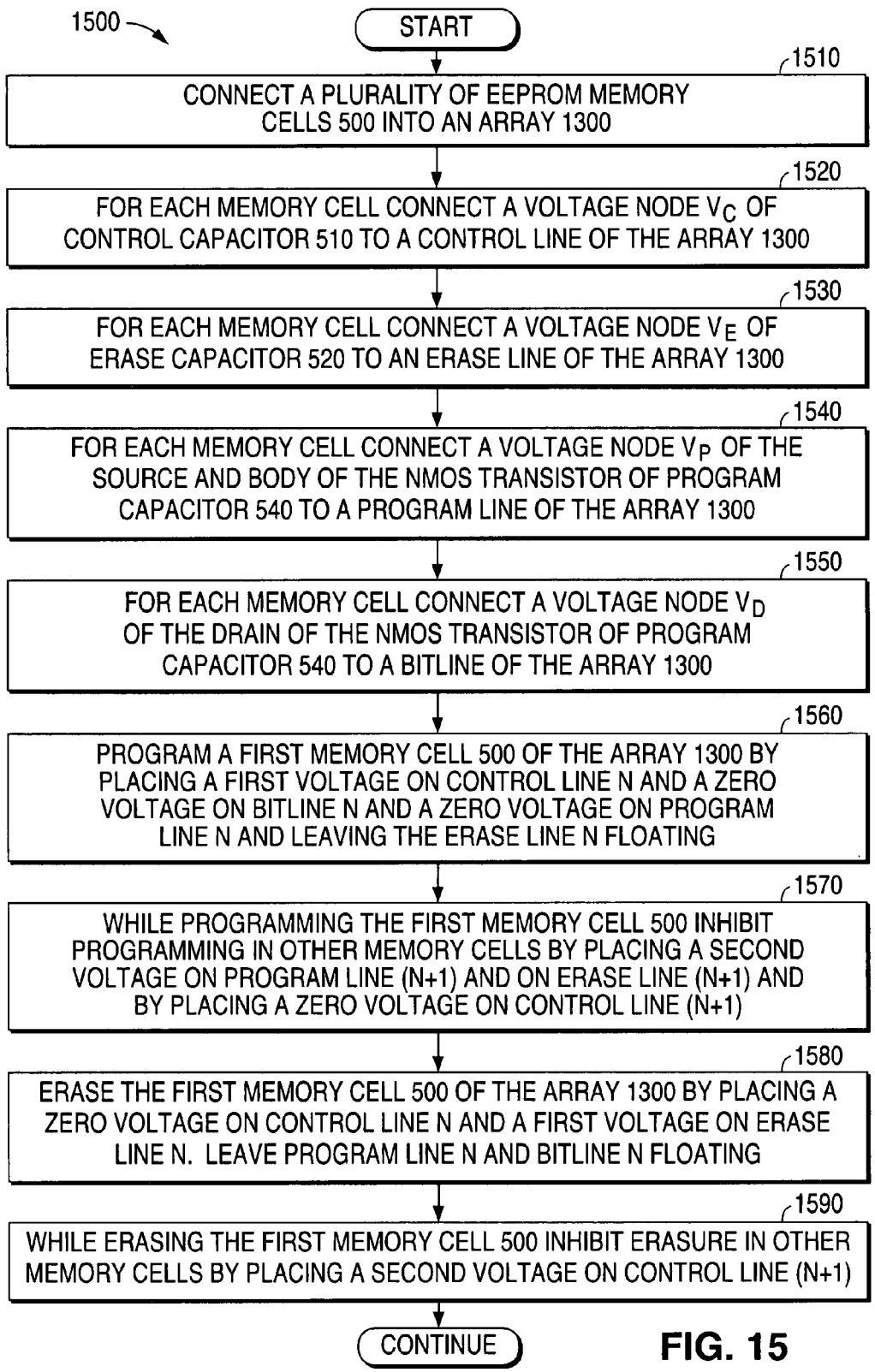
FIG. 15 illustrates a flow chart showing the steps of a second advantageous embodiment of the method of the present invention.

FIG. 15 illustrates a flow chart 1500 showing the steps of an advantageous embodiment of the method of the present invention. A plurality of EEPROM memory cells 500 of the present invention are connected to form a memory array architecture 1300 ("array 1300") (step 1510). For each memory cell, connect a voltage node $V_C$ of control capacitor 510 to a control line 1330 of the array 1300 (step 1520). For each memory cell, connect a voltage node $V_E$ of the erase capacitor 520 to an erase line 1340 of the array 1300 (step 1530).

For each memory cell, connect a voltage node $V_P$ of the source and body of the NMOS transistor of the program capacitor 540 to a program line 1330 of the array 1300 (step 1540). For each memory cell, connect a voltage node $V_D$ of the drain of the NMOS transistor of the program capacitor 540 to a bitline 1320 of the array 1300 (step 1550).

Program a first memory cell 500 of the array 1300 by placing a first voltage on Control Line n (1310a) and by placing a zero voltage on Bitline n (1320a) and by placing a zero voltage on Prog Line n (1330a) and by leaving the Erase Line n (1340a) floating (step 1560). While programming the first memory cell 500 inhibit programming in the other memory cells of the array 1300 by placing a second voltage on Prog Line n+1 (1330b) and on Erase Line n+1 (1340b) where the second voltage has a magnitude that is preferably one half (0.5) of the magnitude of the first voltage that is placed on Control Line n (1310a) and on Bitline n (1320a). A zero voltage is also placed on Control Line n+1 (1310b) (step 1570).

Erase the first memory cell 500 of the array 1300 by placing a zero voltage on Control Line n (1310a) and a first voltage on Erase Line n (1340a) and by leaving the Prog Line n (1330a) floating and by leaving the Bitline n (1320a) floating (step 1580). While erasing the first memory cell 500 inhibit erasure in other memory cells by placing a second voltage on Control Line n+1 (1310b) where the magnitude of the second voltage is preferably one half of the magnitude of the first voltage that is placed on Erase Line n (1340a) (step 1590).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell comprising:
a program capacitor comprising a first NMOS transistor having a gate, a source and a drain; and
a control capacitor comprising a second NMOS transistor having a gate that is coupled to the gate of the first NMOS transistor to form a floating gate;
wherein said first NMOS transistor operates as a program capacitor during a programming operation of said memory cell and operates as a read transistor during a read operation of said memory cell.

2. The memory cell as claimed in claim 1, wherein said programming operation of said memory cell is performed by a Fowler-Nordheim programming process.

3. The memory cell as claimed in claim 1, wherein the source and a P well of said first NMOS transistor are connected to a first terminal of said first NMOS transistor and wherein the drain of said first NMOS transistor is connected to a second terminal of said first NMOS transistor.

4. The memory cell as claimed in claim 1, further comprising an erase capacitor comprising a third NMOS transistor having a gate that is coupled to the floating gate of the memory cell.

5. The memory cell as claimed in claim 3, wherein a program voltage is connected to said first terminal and to said second terminal when said first NMOS transistor operates as a program capacitor during a programming operation of said memory cell.

6. The memory cell as claimed in claim 3, wherein a bias voltage is connected to said second terminal when said first NMOS transistor operates as a read transistor during a read operation of said memory cell.

7. The memory cell as claimed in claim 3, wherein a size of said control capacitor is ten times larger than a size of said program capacitor.

8. The memory cell as claimed in claim 3, further comprising a deep N well isolation structure that isolates a P well of said first NMOS transistor and isolates a P well of said second NMOS transistor from other elements of said memory cell.

9. The memory cell as claimed in claim 4, wherein an erase operation of said memory cell is performed by a Fowler-Nordheim erase process.

10. The memory cell of claim 4, wherein a size of said control capacitor is ten times larger than a size of said erase capacitor.

11. The memory cell of claim 4, further comprising a deep N well isolation structure that isolates a P well of said third NMOS transistor from other elements of said memory cell.

12. An electrically erasable programmable read only memory (EEPROM) device that comprises at least one memory cell that comprises:
a program capacitor comprising a first NMOS transistor having a gate, a source and a drain;

a control capacitor comprising a second NMOS transistor having a gate that is coupled to the gate of the first NMOS transistor to form a floating gate; and an erase capacitor comprising a third NMOS transistor having a gate that is coupled to the floating gate;

wherein said first NMOS transistor operates as a program capacitor during a programming operation of said memory cell and operates as a read transistor during a read operation of said memory cell.

13. The electrically erasable programmable read only memory (EEPROM) device as claimed in claim 12, wherein a programming operation of said memory cell is performed by a Fowler-Nordheim programming process and an erase operation of said memory cell is performed by a Fowler-Nordheim erase process.

14. The electrically erasable programmable read only memory (EEPROM) device as claimed in claim 13 wherein said programming operation of said memory cell is conducted through a gate oxide of said first NMOS transistor and wherein said erase operation of said memory cell is conducted through a gate oxide of said third NMOS transistor.

15. The electrically erasable programmable read only memory (EEPROM) device as claimed in claim 13 wherein a source and a P well of said first NMOS transistor are connected to a first terminal of said first NMOS transistor and wherein a drain of said first NMOS transistor is connected to a second terminal of said first NMOS transistor;

wherein a program voltage is connected to said first terminal and to said second terminal of said first NMOS transistor when said first NMOS transistor operates as a program capacitor during a programming operation of said memory cell; and wherein a bias voltage is connected to said second terminal of said first NMOS transistor when said first NMOS transistor operates as a read transistor during a read operation of said memory cell.

16. The electrically erasable programmable read only memory (EEPROM) device as claimed in claim 13, further comprising a deep N well isolation structure that isolates a P well of said first NMOS transistor and isolates a P well of said second NMOS transistor and isolates a P well of said third NMOS transistor from other elements of said memory cell.

17. A method of operating an array of electrically erasable programmable read only memory (EEPROM) memory cells, said method comprising the steps of:

for each memory cell, connecting a gate of a first NMOS transistor of a program capacitor and a gate of a second NMOS transistor of a control capacitor and a gate of a third NMOS transistor of an erase capacitor to form a floating gate;

for each memory cell, connecting a source and a drain and a body of said second NMOS transistor of said control capacitor to a control line of said array;

for each memory cell, connecting a source and a drain and a body of said third NMOS transistor of said erase capacitor to an erase line of said array;

for each memory cell, connecting a source and a body of said first NMOS transistor of said program capacitor to a program line of said array; and for each memory cell, connecting a drain of said first NMOS transistor of said program capacitor to a bitline of said array.

18. The method as claimed in claim 17, further comprising the step of:

programming a first memory cell of said array to a Memory State 1 comprising the steps of:

placing a programming voltage on a first control line "n";

placing a zero voltage on a first bitline "n";

placing a zero voltage on a first program line "n"; and leaving a first erase line "n" floating.

19. The method as claimed in claim 17, further comprising the step of:

programming a first memory cell of said array to a Memory State 0 to erase said first memory cell, comprising the steps of:

placing an erase voltage on a first erase line "n";

placing a zero voltage on a first control "n";

leaving a first program line "n" floating; and leaving a first bitline line "n" floating.

20. The method as claimed in claim 18, further comprising the step of:

inhibiting a programming process in other memory cells of said array during a programming process of said first memory cell comprising the steps of:

placing a second voltage that is lower than said programming voltage on a second program line "n+1";

placing said second voltage on a second erase line "n+1"; and placing a zero voltage on a second control line "n+1".

21. The method as claimed in claim 20 wherein said second voltage that is lower than said programming voltage is one half of said programming voltage.

22. The method as claimed in claim 19, further comprising the step of:

inhibiting an erase process in other memory cells of said array during an erase process of said first memory cell comprising the step of:

placing a second voltage that is lower than said erase voltage on a second control line "n+1".

23. The method as claimed in claim 22 wherein said second voltage that is lower than said erase voltage is one half of said erase voltage.

* * * * *